(12) United States Patent
Amidi et al.

(10) Patent No.: US 8,767,463 B2
(45) Date of Patent: Jul. 1, 2014

(54) NON-VOLATILE DYNAMIC RANDOM ACCESS MEMORY SYSTEM WITH NON-DELAY-LOCK-LOOP MECHANISM AND METHOD OF OPERATION THEREOF

(75) Inventors: Mike H. Amidi, Lake Forest, CA (US); Kelvin Marino, Laguna Hills, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 322 days.

(21) Appl. No.: 13/207,503

(22) Filed: Aug. 11, 2011

(65) Prior Publication Data

US 2013/0039128 A1 Feb. 14, 2013

(51) Int. Cl.
*G11C 14/00* (2006.01)
(52) U.S. Cl.
USPC ............... 365/185.08; 365/51; 365/189.02; 365/194; 365/233.1; 365/233.13
(58) Field of Classification Search
USPC ............ 365/51, 189.02, 194, 233.1, 233.13
See application file for complete search history.

(56) References Cited

U.S. PATENT DOCUMENTS

| | | | |
|---|---|---|---|
| 7,751,261 B2 | 7/2010 | Cho | |
| 7,773,435 B2 | 8/2010 | Cho | |
| 2007/0046511 A1* | 3/2007 | Morzano et al. | ............... 341/101 |
| 2009/0307456 A1 | 12/2009 | Patwari et al. | |
| 2010/0052625 A1 | 3/2010 | Cagno et al. | |
| 2010/0185883 A1 | 7/2010 | Hamilton | |
| 2010/0202238 A1* | 8/2010 | Moshayedi et al. | .......... 365/228 |

* cited by examiner

*Primary Examiner* — Tha-O H Bui
(74) *Attorney, Agent, or Firm* — Ishimaru & Associates LLP (57) ABSTRACT

A method of operation of a non-volatile dynamic random access memory system including: accessing a dynamic random access memory; managing a delay-locked-loop control in the dynamic random access memory; sourcing timing inputs to the dynamic random access memory by a control logic unit with the delay-locked-loop control disabled including: selecting a back-up interface through a first multiplexer and a second multiplexer, asserting an on-board termination, and accessing data in the dynamic random access memory by the control logic unit at a lower frequency; and enabling a memory control interface by the control logic unit, with the delay-locked-loop control enabled including: selecting a host interface through the first multiplexer, the second multiplexer, or a combination thereof, disabling the on-board termination, and accessing the data in the dynamic random access memory by the memory control interface at a delay-locked-loop frequency.

20 Claims, 6 Drawing Sheets

NON-VOLATILE DYNAMIC RANDOM ACCESS MEMORY SYSTEM WITH NON-DELAY-LOCK-LOOP MECHANISM AND METHOD OF OPERATION THEREOF

TECHNICAL FIELD

The present invention relates generally to dynamic random access memory system, and more particularly to a system for operating a dynamic random access memory in a slow mode.

BACKGROUND ART

Contemporary high performance computing main memory systems are generally composed of one or more dynamic random access memory (DRAM) devices. DRAM devices typically include memory cells arranged in horizontal grids with row and column decoding logic to access values stored at specific addresses. These devices may be physically assembled on a dual in-line memory module (DIMM). The DIMM may provide simple upgrade or maintenance capabilities based on the ease of insertion and removal of the DIMM structure.

Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/sub-system design and/or structure. High-availability systems present further challenges as related to overall system reliability due to customer expectations that new computer systems will markedly surpass existing systems in regard to mean-time-between-failure (MTBF). Other frequent customer requirements further exacerbate the memory system design challenges, and include such items as ease of upgrade and reduced system environmental impact (such as space, power and cooling).

In an effort to make the systems more reliable, a new DIMM structure has made a debut. The non-volatile dual in-line memory module (NVDIMM) may use a combination of DRAM and non-volatile memory, such as NAND flash memory. The NVDIMM may provide a very fast interface for accesses by the system processor and a non-volatile memory that operates at a much slower data rate for data protection.

A state-of-the art flash-backed memory module stores the contents of the DRAM segment into an on-board flash memory during a power-loss event. However, the flash write speed is considerably slower than that of DRAM read speed. Therefore, various methods are needed to manage this backup procedure efficiently. This includes such things as either wider flash bus or lower clock speed or a combination of both. However, memories such as DDR3, used on the majority of new computer systems, have a delay-locked-loop (DLL) that does not run at slow speeds.

A method is required to keep the DRAM operational at low clock speeds. Thus, a need still remains for a non-volatile dynamic random access memory system with non-delay-locked-loop mode in order to simplify the interface between the high speed DRAM and the slower non-volatile memory. In view of the extreme need for data reliability in many of today's computer systems, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a non-volatile dynamic random access memory system including: accessing a dynamic random access memory; managing a delay-locked-loop control in the dynamic random access memory; sourcing timing inputs to the dynamic random access memory by a control logic unit with the delay-locked-loop control disabled including: selecting a back-up interface through a first multiplexer and a second multiplexer, asserting an on-board termination, and accessing data in the dynamic random access memory by the control logic unit at a lower frequency; and enabling a memory control interface by the control logic unit, with the delay-locked-loop control enabled including: selecting a host interface through the first multiplexer, the second multiplexer, or a combination thereof, disabling the on-board termination, and accessing the data in the dynamic random access memory by the memory control interface at a delay-locked-loop frequency.

The present invention provides an non-volatile dynamic random access memory system including: a dynamic random access memory; a delay-locked-loop control in the dynamic random access memory; a control logic unit coupled to the dynamic random access memory trough timing inputs, with the delay-locked-loop control disabled including: a back-up interface selected through a first multiplexer and a second multiplexer, and a non-volatile memory coupled to the control logic unit for storing data from the dynamic random access memory by the control logic unit at a lower frequency; and a memory control interface enabled by the logic control unit, with the delay-locked-loop control enabled, including: a host interface coupled to the first multiplexer, the second multiplexer and the memory control interface, and a control line between the first multiplexer and the control logic unit.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. For expository purposes, the term "horizontal" as used herein is defined as a plane parallel to the plane or surface of the Earth, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between at least two elements.

Figure 1:
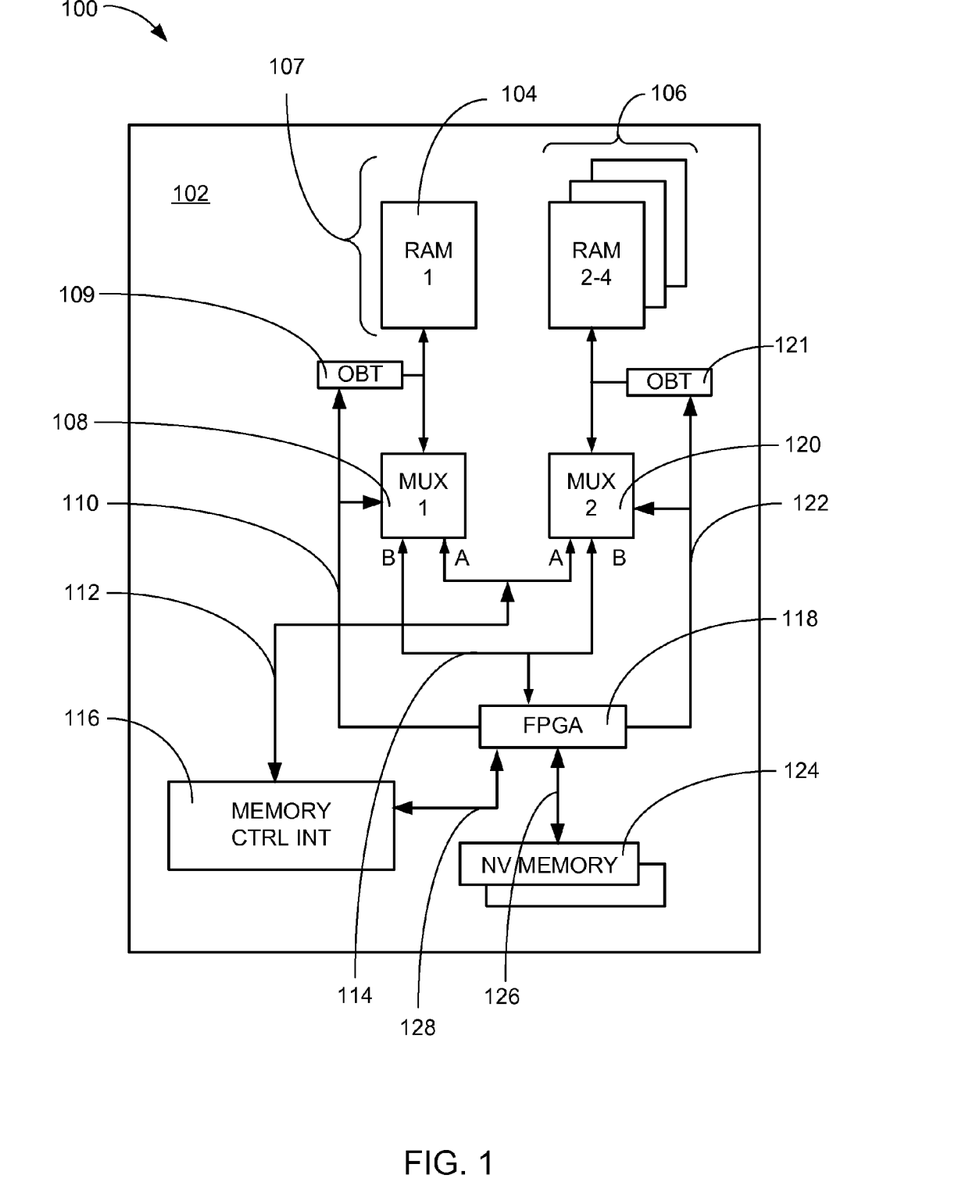
FIG. 1 is a functional block diagram of a non-volatile dynamic random access memory system with non-delay-locked-loop mechanism, in an embodiment of the present invention.

Referring now to FIG. 1, therein is shown is a functional block diagram of a non-volatile dynamic random access memory system 100 with non-delay-locked-loop mechanism, in an embodiment of the present invention. The functional block diagram of the non-volatile dynamic random access memory system 100 depicts a carrier 102, such as a printed circuit board, having a first rank memory device 104 and subsequent rank memory devices 106. The first rank memory device 104 and the subsequent rank memory devices 106 are volatile random access memory devices and may be dynamic random access memory (DRAM) 107 that loses data when power is removed.

A first multiplexer 108 may be coupled to the first rank memory device 104. The first multiplexer 108, is a selection device for passing a first or second signal set, may provide a reference clock, address, and data lines to the first rank memory device 104. It is to be understood that the data lines may be bi-directional, while the reference clock and the address lines are unidirectional from the first multiplexer 108. An on-board termination 109, for maintaining the signal integrity of the lines during low speed operations, may be coupled to the data lines and address lines. The first multiplexer 108 and the on-board termination 109 may have a control line 110 for managing the output of the first multiplexer 108, controlling the on-board termination 109, and selecting between a host interface 112 and a back-up interface 114.

The on-board termination 109 may include a series of termination elements (not shown), such as resistive termination or active termination, that are selectively coupled to a termination voltage at one end with the opposing end coupled to the individual address and data lines sourced from the first multiplexer 108. The on-board termination 109 may be activated by the control line 110 when the back-up interface 114 is selected.

It is understood that the host interface 112 and the back-up interface 114 both have a substantially identical number of address and data lines. The host interface 112 may be sourced from a memory control interface 116, which may include an interface connector (not shown). The back-up interface 114 may be sourced from a control logic unit 118, which may be implemented in a field programmable gate array (FPGA) or an application specific integrated circuit (ASIC).

The non-volatile dynamic random access memory system 100 with non-delay-locked-loop (non-DLL) operation mechanism will allow the non-volatile dynamic random access memory system 100 to operate DRAM at a lower frequency, such as 125 MHz (for example reduced from 667 MHz down to 125 MHz). This is crucial in the operation of a non-volatile dual in-line memory module (NVDIMM) as the control logic unit 118 may function as a local memory controller and can have an operational frequency of 125 MHz. This lower frequency will reduce the read and write speed of each Double Data Rate (DDR) DRAM device to for example 125 MHz*2-bit per clock*8-bit DRAM=250 MB/sec bandwidth vs. in normal operation it would be 667 MHz*2-bit per clock*8-bit DRAM=1333 MB/sec or 1.33 GB/sec.

A second multiplexer 120, is a selection device for passing a first or second signal set, may be coupled to the subsequent rank memory devices 106. The subsequent rank memory devices 106 may include additional memory devices of equal or different size as compared to the first rank memory device 104. The subsequent rank memory devices 106 may include any number of additional memory devices. A subsequent on-board termination 121 may be coupled to the reference clock, data lines, and address lines from the second multiplexer 120 for maintaining the signal integrity of the lines during low frequency operations.

By way of example, the subsequent rank memory devices 106 is shown to include three of the dynamic random access memory 107, but any number of the dynamic random access memory 107 may be coupled to the second multiplexer 120. This is an example only and the subsequent rank memory devices 106 may include a different number of the dynamic random access memory 107.

A back-up control line 122 may be sourced from the control logic unit 118. The back-up control line 122 may control the subsequent on-board termination 121 and manage the output of the second multiplexer 120 for selecting between the host interface 112 and the back-up interface 114.

The subsequent on-board termination 121 may include a series of resistive elements (not shown) that are selectively coupled to a termination voltage at one end with the opposing end coupled to the individual address and data lines sourced from the second multiplexer 120. The subsequent on-board termination 121 may be activated by the back-up control line 122 when the back-up interface 114 is selected.

A non-volatile random access memory (NVRAM) 124 may include a number of flash memory chips having a sufficient capacity to store all of the data from the first rank memory device 104 and the subsequent rank memory devices 106. The non-volatile memory 124 may be coupled to the control logic unit 118 through a non-volatile (NV) memory bus 126. The NV memory bus 126 may include data lines as well as address and control lines. The data from the dynamic random access memory 107 is processed by the control logic unit 118 to be aligned for multiple units of the non-volatile memory 124, which, for example, may be limited to operate at a maximum data bandwidth of approximately 80 MB/sec.

The dynamic random access memory 107 in non-delay-locked-loop mode must be able to transfer one block of the data from the dynamic random access memory 107 to multiple units of the non-volatile memory 124 in order to keep up with incoming bandwidth. In this example the control logic unit 118 may be coupled to as many units of the non-volatile memory 124 as is required to support the maximum bandwidth of the non-volatile memory 124.

An interface status bus 128 may couple the memory control interface 116 to the control logic unit 118. The interface status bus 128 may convey availability of the first rank memory device 104 and the subsequent rank memory devices 106. The interface status bus 128 may also provide early warning for system shut down or other error conditions that may activate a memory back-up process.

The above described hardware may detect a proprietary back-up command, system fault conditions, or power down warnings in order to initiate a total memory back-up process. During the total memory back-up process the contents of the first rank memory device 104 and the subsequent rank memory devices 106 are stored in the non-volatile memory 124.

It has been discovered that during system power-down, data held in the first rank memory device 104 may be transferred to the non-volatile memory 124 and preserved during the period a system is powered down.

The data held in the non-volatile memory 124 may be restored to the first rank memory device 104 for use by the system central processing unit (CPU), not shown, in substantially less time than it takes to restore all of the system memory. By presenting the first rank memory device 104 to the CPU the system may start normal operation while the subsequent rank memory devices 106 are restored.

Figure 2:
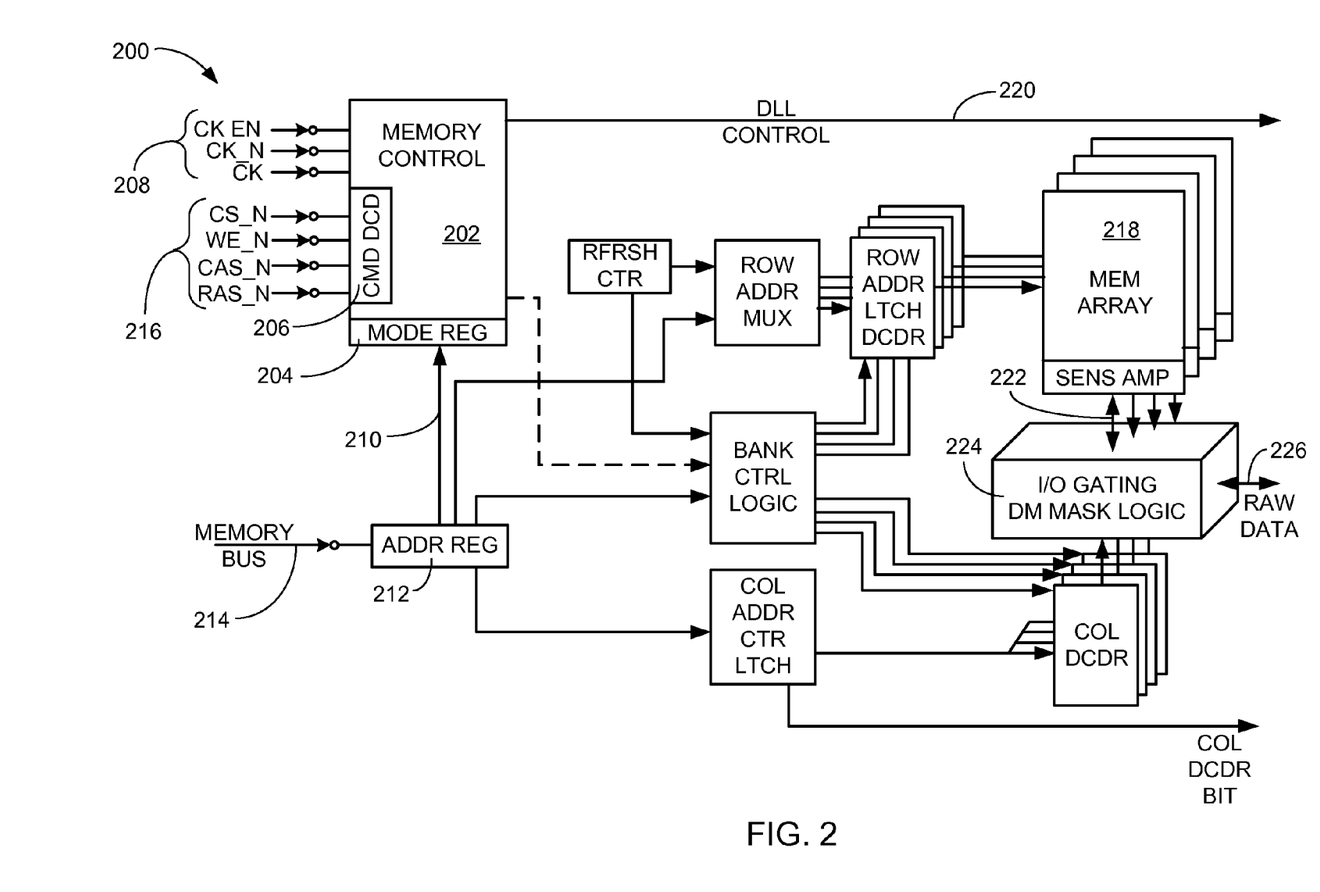
FIG. 2 is a functional block diagram of a data management section of the dynamic random access memory (DRAM) of FIG. 1.

Referring now to FIG. 2, therein is shown a functional block diagram of a data management section 200 of the dynamic random access memory 107, of FIG. 1, as utilized for the present invention. The functional block diagram of the data management section 200 of the dynamic random access memory 107 depicts a memory control block 202 having a mode register 204 and a command decode interface 206.

The memory control block 202 may have timing inputs 208, such as clock enable and a differential clock input pair. The mode register 204 may receive a registered address bus 210 sourced from an address register 212, which captures and holds the addresses from a memory address bus 214.

The command decode interface 206 may receive a set of data management inputs 216, such as chip select (CS_N), write enable (WE_N), column address strobe (CAS_N), and row address strobe (RAS_N). The combination of the registered address bus 210 and the data management inputs 216 may control the operation and set-up of a memory array 218, such as multiple banks of storage circuit arrays.

During normal operation of the memory array 218, a system clock rate in the range of 667 MHz may be provided at the timing inputs 208, such as the differential clock input pair, of the memory control block 202. When the system loses power the timing inputs 208 may be lost. In order to implement the non-volatile dynamic random access memory system 100 of FIG. 1, a new source of the timing inputs 208 may be provided by the control logic unit 118 of FIG. 1 at a frequency, such as 125 MHz, which is lower than the specified operational frequency of the dynamic random access memory 107.

The present invention provides a method to keep the memory array 218 operational at the lower frequency. In order to operate the memory array 218 at a lower frequency than the intended operational frequency requires accessing the mode register 204 in order to negate a delay-locked-loop control 220. This access will disable the internal delay-locked-loop (not shown), which only operates at a specific operational frequency, and allows the memory array 218 to function properly at a frequency that is below the normal operational frequency.

Once the delay-locked-loop is turned off, other automatic functions such as an on-die termination (ODT) functionality will no longer be operational and may inherently cause signal integrity related issues that could store incorrect data in the memory array 218. In order to address this issue an external termination (not shown), such as the resistive termination or the active termination, may be provided by the control logic unit 118.

In order for the non-volatile dynamic random access memory system 100 to perform a complete save or restore of the data within the memory array 218, the back-up interface 114, of FIG. 1, provides the timing inputs 208 including the differential clock input pair at substantially 125 MHz. The control logic unit 118 of the non-volatile dynamic random access memory system 100 may save or restore the data in the memory array 218 without causing data loss or data integrity issues.

Array data 222 may be communicated between the memory array 218 and an I/O gating block 224 for managing read and write data 226. The read and write data 226 and the array data 222 are bidirectional busses that can support data moving in either direction. The data flow is controlled by the data management inputs 216.

The timing associated with the RAW data 226 moving through the I/O gating block 224 and through the array data 222 to the memory array 218 is operationally managed by the delay-locked-loop (not shown), which operates correctly at the operational speed, such as 667 MHz. When the delay-locked-loop control 220 has disabled the delay-locked-loop, the timing can be controlled by careful management of the data management inputs 216, the timing inputs 208, and the memory address bus 214. The timing of these lines is provided by the control logic unit 118.

Figure 3:
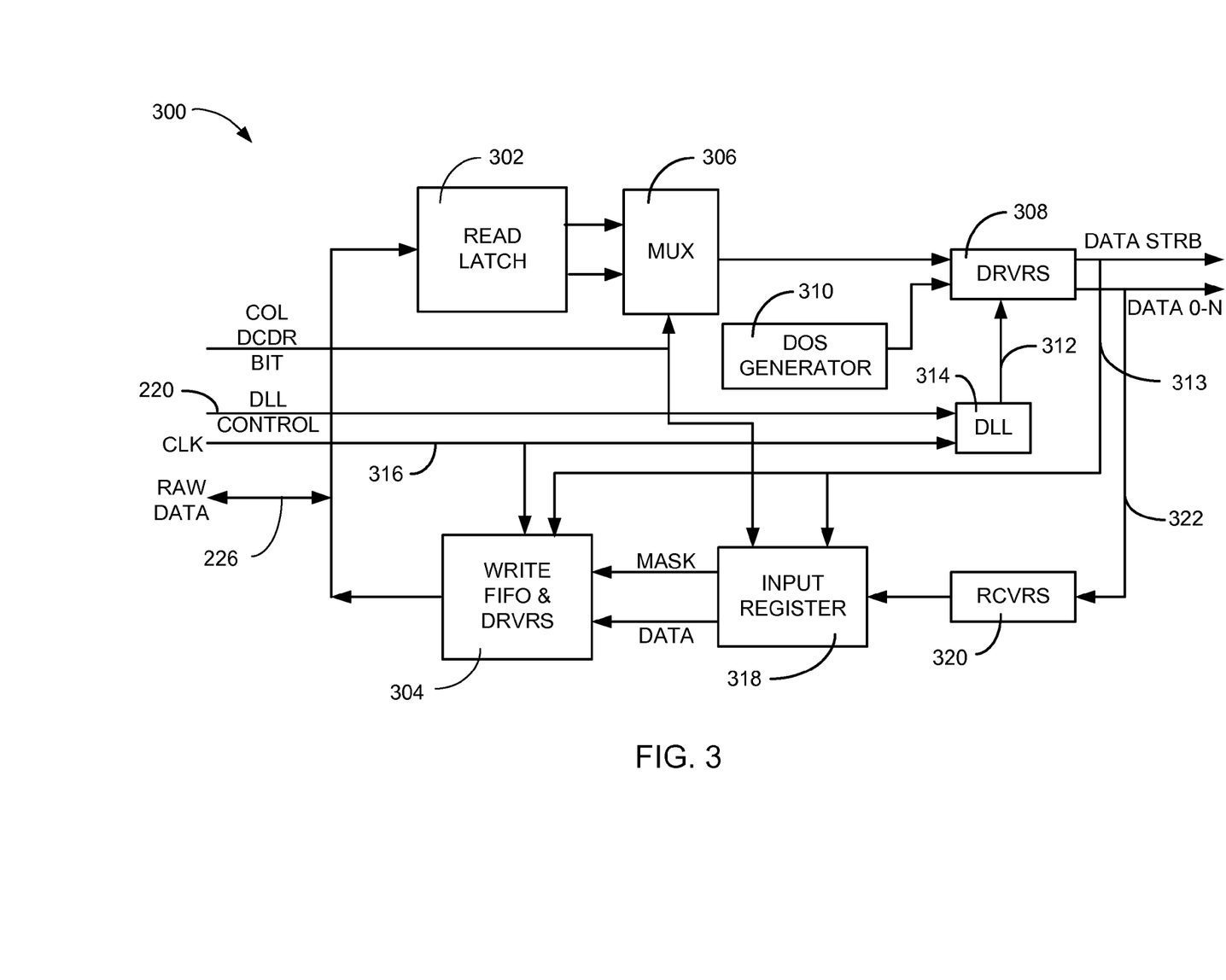
FIG. 3 is a functional block diagram of a data input/output section of the dynamic random access memory (DRAM) of FIG. 1.

Referring now to FIG. 3, therein is shown is a functional block diagram of a data input/output section 300 of the dynamic random access memory (DRAM) 107, of FIG. 1, as utilized for the present invention. The functional block diagram of the data input/output section 300 depicts the RAW data 226 coupled to a read latch 302, for capturing data that has been read from the memory array 218 of FIG. 2, and a write register block 304 for sourcing the RAW data 226 that is to be written to the memory array 218.

The output of the read latch 302 can be presented in even/odd outputs that are selected by an output multiplexer 306 to load output drivers 308. A data output strobe (DOS) generator 310 may provide a qualifying gate that is combined with a clock 312, within the output drivers 308, in order to form a data strobe 313 presented on the interface.

The clock 312 may be sourced from a delay-locked-loop 314 during normal operation. When the delay-locked-loop control 220 enables the delay-locked-loop 314, the internal circuitry generates a pulse that is output to the clock 312. When the delay-locked-loop control 220 disables the delay-locked-loop 314, an interface clock 316 is passed through the delay-locked-loop 314, to the clock 312, without utilizing the internal circuitry of the delay-locked-loop 314.

It is understood that for simplicity, not all of the control circuitry is shown or described. One having ordinary skill in the art would recognize that the operation of the dynamic random access memory 107 of FIG. 1 while supporting the present invention is used by the invention for data access.

The write register block 304 may receive information from an input register 318 in the form of mask and data bits. The input register 318 may be coupled to input receivers 320. The data strobe 313 may be a bi-directional line that may also be sourced externally for loading information from a data bus 322 during a write operation, which would store the written data into the memory array 218, of FIG. 2.

Figure 4:
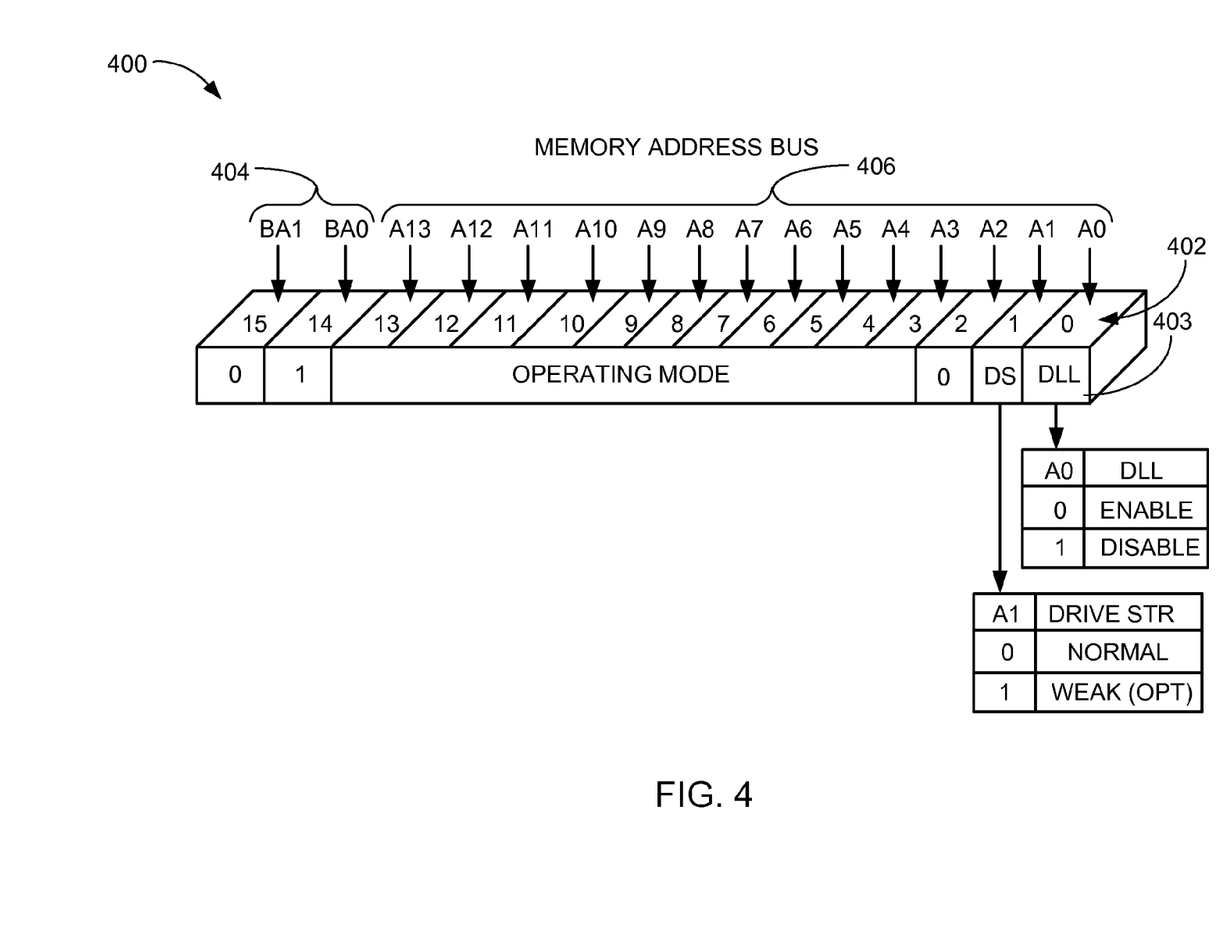
FIG. 4 is a functional diagram of an extended mode register for controlling functions of the dynamic random access memory (DRAM) of FIG. 1.

Referring now to FIG. 4, therein is shown a functional diagram of an extended mode register 400 for controlling functions of the dynamic random access memory 107 of FIG. 1 as utilized for the present invention. The functional diagram of the extended mode register 400 depicts bit locations 402 having an arrangement of bit location 0 through bit location 15.

In order to meet the operational requirements of the DRAM 107 of FIG. 1 an initialization sequence must be followed prior to the normal operation of the device. At some time after the system power and the timing inputs 208, such as the clock of FIG. 2, have stabilized, a write operation to the extended mode register 400 followed by a write operation to the mode register (not shown) are required to assure the functionality of the DRAM 107.

A bank address 404, having bits BA0 and BA1, are located in the bit location 14 and bit location 15 respectively, of the bit locations 402. A write operation to the extended mode register 400 requires the bank address 404 to have bits BA0 asserted and BA1 negated. Address bits 406, having address bits A0 through A13, must have A2 through A13 negated. In this configuration the A0 bit represents a delay-locked-loop control 403, which controls the DLL 314, of FIG. 3, and the A1 bit controls the drive strength of the output drivers 308, of FIG. 3. The normal operational state of the DRAM 107 is achieved by a write operation of the extended mode register 400 with the bits BA0 asserted, BA1 negated, and the address bits 406 negated. This configuration asserts the delay-locked-loop control 403 and provides full drive strength to the output drivers 308.

An aspect of the present invention is to disable the DLL 314 by writing the bits BA0 asserted, BA1 negated, A1-13 negated, and A1 asserted. By disabling the DLL 314, a slower clock may be used to control the timing of the DRAM 107. The application of the slower clock may allow the controlled transfer of data between the DRAM 107 and the non-volatile memory 124, of FIG. 1.

An impact of the disabling of the DLL 314 is that an on-die termination (not shown) is also disabled by the same write operation. In order to maintain the signal integrity of the data transfer the on-board termination 109, of FIG. 1, and the subsequent on-board termination 121, of FIG. 1, may be activated while the transfer between the DRAM 107 and the non-volatile memory 124 takes place. The on-board termination 109 and the subsequent on-board termination 121 may be selectively disabled when the DLL 314 and the on-die termination, of the first rank memory device 104 and the subsequent rank memory devices 106 respectively, are once again enabled.

By disabling the DLL 314, a low speed operation of data transfer may be performed. As an example, the DRAM 107 that normally operates on a 667 MHz clock may be operated by a 125 MHz clock. The slower clock rate would not function correctly if the DLL 314 was enabled, but with the DLL 314 disabled the entire content of the DRAM 107 can be copied to the non-volatile memory 124 with the support of the control logic unit 118, of FIG. 1.

The low speed operation may be a transfer of the data content from the DRAM 107 to the non-volatile memory 124 during a power-down operation or it might be a transfer from the non-volatile memory 124 to the DRAM 107 to restore the memory content on power-on. In both of these operations the entire data content of the DRAM 107 may be transferred at the reduced clock rate, for example 125 MHz.

During the power-on process, the extended mode register 400 may be written to enable the DLL as well as the on-die termination of the DRAM 107 after the data transfer and prior to passing control to the memory controller (not shown). The write operation may provide writing the bits BA0 asserted, BA1 negated, A0-13 negated. The DRAM 107 may require a preparation time consisting of 200 cycles of the clock 316, of FIG. 3, in order to be functional for high speed transfers.

Figure 5:
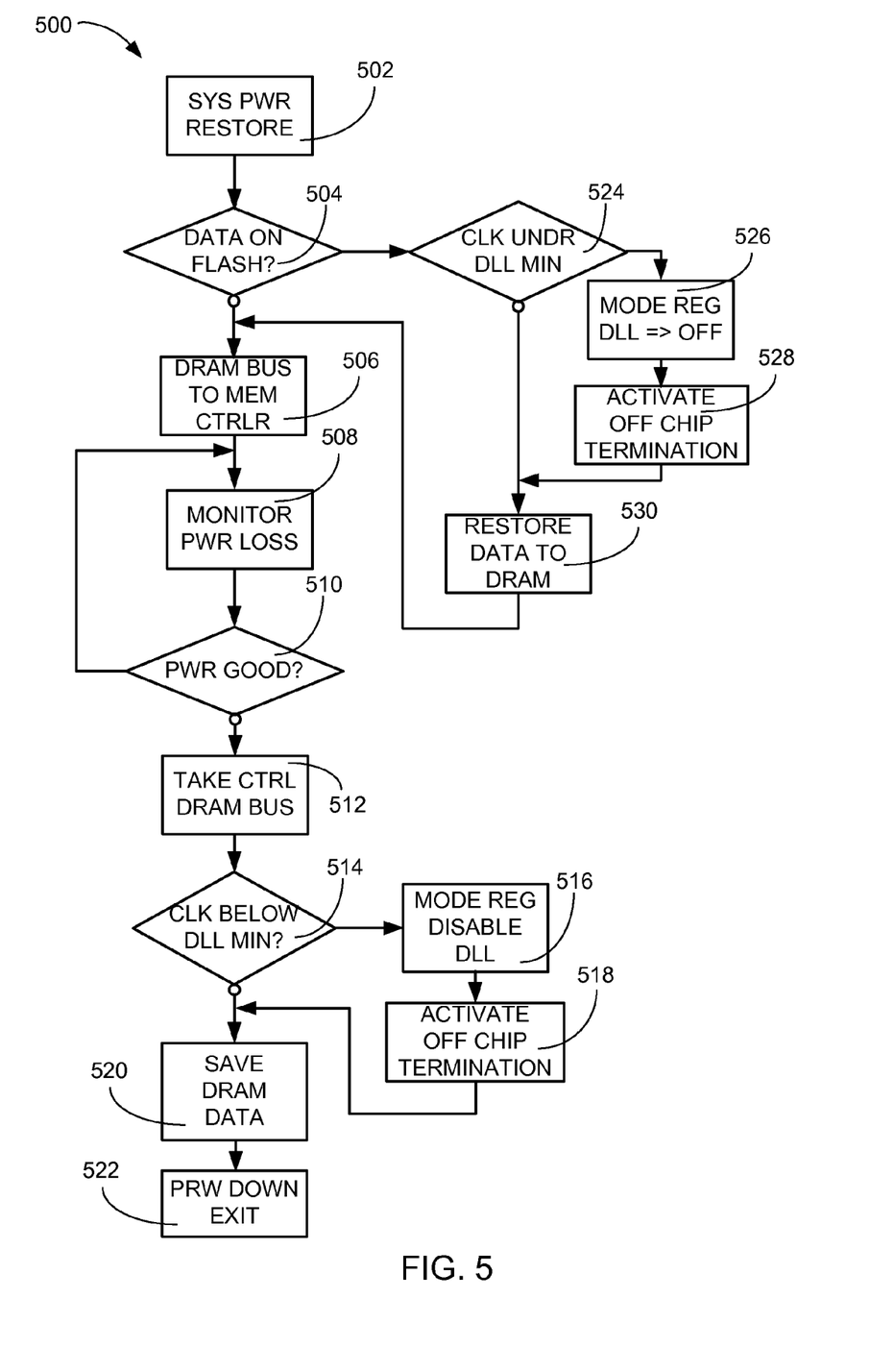
FIG. 5 is a control flow chart of a power cycling process in an application of the present invention.

Referring now to FIG. 5, therein is shown a flow chart of a power cycling process 500 in an application of the present invention. The flow chart of the power cycling process 500 depicts a system power restore block 502, such as an initial power-on of a computer system having the non-volatile dynamic random access memory system 100, of FIG. 1. It is understood that this entry of the flow chart of the power cycling process 500 may represent any system boot initialization process where a reset (not shown) has been asserted.

The flow proceeds to a data in flash decision 504 to determine whether the non-volatile memory 124 of FIG. 1 has data that should be copied to the first rank memory device 104 and the subsequent rank memory devices 106. If no data is detected in the non-volatile memory 124, the flow proceeds to a bus to memory controller block 506, which prepares the DRAM 107 of FIG. 1 for use by the host computer system (not shown). In order to prepare the DRAM 107 for use, a write operation is performed to the mode register and the extended mode register 400, of FIG. 4.

The write operation to the extended mode register 400 must enable the DLL 314 of FIG. 3 for high speed operation. Since no data was detected by the data in flash decision 504, both the first rank memory device 104 of FIG. 1 and the subsequent rank memory devices 106 of FIG. 1 are selected to be accessible by the memory control interface 116 of FIG. 1. The process of enabling the DLL 314 requires 200 cycles of the clock 316 of FIG. 3 in order to be functional for high speed transfers, as in this example.

At the completion of the 200 cycles of the clock 316 of FIG. 3 in preparation for normal operation, the flow proceeds to a monitor system power block 508. This block is part of the two step idle loop for monitoring the state of the system power during normal system operation. After capturing the state of the system power, the flow proceeds to a power good decision block 510, which represents the second step of the two step idle loop.

As long as the system power remains stable, the flow returns to the input of the monitor system power block 508. The two step idle loop provides an efficient monitor for detecting an early power down process. When a power down event is detected the flow proceeds out of the two step idle loop to a control DRAM block 512.

The control DRAM block 512 activates the control line 110 of FIG. 1 and the back-up control line 122 of the first multiplexer 108 of FIG. 1 and the second multiplexer 120 of FIG. 1 respectively. By activating the control line 110 and the back-up control line 122, control of the interface of the DRAM 107 is switched from the memory control interface 116 to the control logic unit 118 of FIG. 1.

In order to preserve the data within the DRAM 107, the reference clock must be transitioned from the high frequency operational range to the lower frequency controlled range in an orderly manner. The flow proceeds to a check reference clock decision 514. If the reference clock is found to be below the range that provides DLL control, the flow proceeds to a DLL disable block 516.

The DLL disable block 516 performs the write operation to the extended mode register 400 followed by a write operation to the mode register (not shown) as required to assure the non-DLL functionality of the DRAM 107 at the reduced frequency. The flow then proceeds to an enable on-board termination block 518. Since the disabling of the DLL operation, as performed by the write of the extended mode register 400, also disables the internal termination of the DRAM 107, the on-board termination is required to provide good signal quality during subsequent operations.

The flow then proceeds to a save DRAM data block 520. The frequency reduction process requires the completion of 200 cycles of the clock 316, which is sourced through the first multiplexer 108 of FIG. 1 and the second multiplexer 120 of FIG. 1. The input for the reference clock comes from the control logic unit 118. The save DRAM data block 520 may be entered directly if the check reference clock decision 514 determines that the reference clock is not below the range that provides DLL control. This condition can occur if the separate power supplies are provided for the memory controller (not shown) and the non-volatile dynamic random access memory system 100, of FIG. 1.

At the completion of the 200 cycles of the clock 316, the data held in the DRAM 107 is transferred to the non-volatile memory 124 of FIG. 1 under the control of the control logic unit 118. Upon completion of the data transfer to the non-volatile memory 124, the flow proceeds to a power down exit 522, where the flow remains until the system power is restored.

Upon restoring the system power, the flow is initiated in the system power restore block 502. With data held in the non-volatile memory 124, the data in flash decision 504 will exit to a clock under DLL min decision 524.

If the clock under DLL min decision 524 detects that the reference clock is under the frequency for normal DLL operation, the flow proceeds a disable DLL block 526. The disable DLL block 526 performs the write operation to the extended mode register 400 followed by a write operation to the mode register (not shown) as required to assure the non-DLL functionality of the DRAM 107 at the reduced frequency.

The flow then proceeds to an enable on-board termination block 528. Since the disabling of the DLL operation, as performed by the write of the extended mode register 400, also disables the internal termination of the DRAM 107, the on-board termination is required to provide good signal quality during subsequent operations. The flow then proceeds to a restore data to DRAM block 530, which allows the control logic unit 118 to manage the transfer of the data in the non-volatile memory 124 back to its original location in the DRAM 107, prior to system power-down.

After the data has been restored in the DRAM 107, a write operation to the extended mode register 400 followed by a write operation to the mode register (not shown) as required to assure the DLL functionality of the DRAM 107 at the operational frequency. The control logic unit 118 must allow 200 cycles of the reference clock with the DLL enabled in order to assure proper operation of the DRAM 107. If the under DLL min decision 524 detects that the reference clock is not under the frequency for normal DLL operation, the flow proceeds directly from the under DLL min decision 524 to the restore data to DRAM block 530.

Upon exiting the restore data to DRAM block 530, all of the initialization values will have been restored to operational values, the DLL 314 has been turned on and the system latency values have been restored for normal operation. The flow then proceeds to the bus to memory controller block 506, which prepares the DRAM 107 for use by the host computer system (not shown). The flow then proceeds to the monitor system power block 508 and remains in the two step idle loop during normal system operation.

Figure 6:
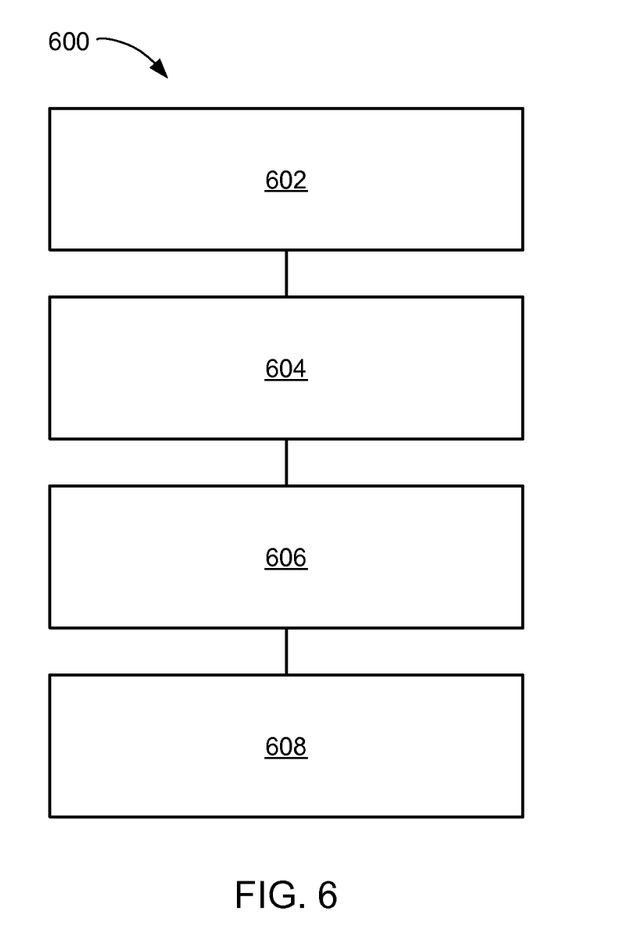
FIG. 6 is a flow chart of a method of operation of the non-volatile dynamic random access memory system in an embodiment of the present invention.

Referring now to FIG. 6, therein is shown a flow chart of a method 600 of operation of a non-volatile dynamic random access memory system in a further embodiment of the present invention. The method 600 includes: accessing a dynamic random access memory in a block 602; managing a delay-locked-loop control in the dynamic random access memory in a block 604; sourcing timing inputs to the dynamic random access memory by a control logic unit with the delay-locked-loop control disabled including: selecting a back-up interface through a first multiplexer and a second multiplexer, asserting an on-board termination, and accessing data in the dynamic random access memory by the control logic unit at a lower frequency in a block 606; and enabling a memory control interface by the control logic unit, with the delay-locked-loop control enabled including: selecting a host interface through the first multiplexer, the second multiplexer, or a combination thereof, disabling the on-board termination, and accessing the data in the dynamic random access memory by the memory control interface at a delay-locked-loop frequency in a block 608.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing system reliability and performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a non-volatile dynamic random access memory system comprising:
   accessing a dynamic random access memory;
   managing a delay-locked-loop control in the dynamic random access memory;
   sourcing timing inputs to the dynamic random access memory by a control logic unit with the delay-locked-loop control disabled including:

selecting a back-up interface through a first multiplexer and a second multiplexer,
asserting an on-board termination, and
accessing data in the dynamic random access memory by the control logic unit at a lower frequency; and
enabling a memory control interface by the control logic unit, with the delay-locked-loop control enabled including:
selecting a host interface through the first multiplexer, the second multiplexer, or a combination thereof,
disabling the on-board termination, and
accessing the data in the dynamic random access memory by the memory control interface at a delay-locked-loop frequency.

2. The method as claimed in claim 1 further comprising accessing an interface status bus by the control logic unit.

3. The method as claimed in claim 1 further comprising transferring data from the dynamic random access memory to a non-volatile memory by the control logic unit.

4. The method as claimed in claim 1 further comprising monitoring a power good decision block for managing the delay-locked-loop control.

5. The method as claimed in claim 1 further comprising enabling a first rank memory device to the memory control interface by the control logic unit.

6. A method of operation of a non-volatile dynamic random access memory system comprising:
accessing a dynamic random access memory having a delay-locked-loop;
managing a delay-locked-loop control for controlling the delay-locked-loop;
sourcing timing inputs to the dynamic random access memory by a control logic unit, with the delay-locked-loop control disabled including:
selecting a back-up interface through a first multiplexer and a second multiplexer,
asserting an on-board termination, and
accessing data in the dynamic random access memory by the control logic unit at a lower frequency; and
enabling a memory control interface by the control logic unit, with the delay-locked-loop control enabled including:
selecting a host interface through the first multiplexer, the second multiplexer, or a combination thereof,
disabling the on-board termination for the first multiplexer, the second multiplexer, or a combination thereof, and
accessing the data in the dynamic random access memory by the memory control interface at a delay locked loop frequency through the first multiplexer, the second multiplexer, or a combination thereof.

7. The method as claimed in claim 6 further comprising accessing an interface status bus by the control logic unit including enabling a first rank memory device.

8. The method as claimed in claim 6 further comprising transferring data from the dynamic random access memory to a non-volatile memory by the control logic unit including sampling a monitor system power block for capturing the state of the system power.

9. The method as claimed in claim 6 further comprising monitoring a power good decision block for managing the delay-locked-loop control including enabling the delay-locked-loop of a first rank memory device while the delay-locked-loop of subsequent rank of memory devices is disabled.

10. The method as claimed in claim 6 further comprising enabling a first rank memory device to the memory control interface by the control logic unit including accessing a subsequent rank of memory devices for transferring data from a non-volatile memory.

11. A non-volatile dynamic random access memory system comprising:
a dynamic random access memory;
a delay-locked-loop control in the dynamic random access memory;
a control logic unit coupled to the dynamic random access memory through timing inputs with the delay-locked-loop control disabled including:
a back-up interface selected through a first multiplexer and a second multiplexer, and
a non-volatile memory coupled to the control logic unit for storing data from the dynamic random access memory by the control logic unit at a lower frequency; and
a memory control interface enabled by the control logic unit, with the delay-locked-loop control enabled including:
a host interface coupled to the first multiplexer, the second multiplexer, and the memory control interface, and
a control line between the first multiplexer and the control logic unit.

12. The system as claimed in claim 11 further comprising an interface status bus coupled to the control logic unit includes the memory control interface blocked.

13. The system as claimed in claim 11 further comprising an on-board termination, coupled to the first multiplexer, controlled by the control logic unit.

14. The system as claimed in claim 11 further comprising a subsequent on-board termination, coupled to the second multiplexer, controlled by the control logic unit.

15. The system as claimed in claim 11 further comprising a first rank memory device coupled to the first multiplexer for controlling a memory bus by the control logic unit or the memory control interface.

16. The system as claimed in claim 11 further comprising a delay-locked-loop in the dynamic random access memory controlled by the control logic unit.

17. The system as claimed in claim 16 further comprising an interface status bus coupled between the control logic unit and the memory control interface for blocking access through the memory control interface.

18. The system as claimed in claim 16 further comprising an on-board termination, coupled to the first multiplexer, with a control line controlled by the control logic unit.

19. The system as claimed in claim 16 further comprising a subsequent on-board termination, coupled to the second multiplexer, with a back-up control line controlled by the control logic unit.

20. The system as claimed in claim 16 further comprising a first rank memory device coupled to the first multiplexer and subsequent rank memory devices coupled to the second multiplexer includes the non-volatile memory accessed for restoring a data to the first rank memory device and the subsequent rank memory devices by the control logic unit.

* * * * *

UNITED STATES PATENT AND TRADEMARK OFFICE
CERTIFICATE OF CORRECTION

PATENT NO. : 8,767,463 B2  
APPLICATION NO. : 13/207503  
DATED : July 1, 2014  
INVENTOR(S) : Amidi et al.

Page 1 of 1

It is certified that error appears in the above-identified patent and that said Letters Patent is hereby corrected as shown below:

On the Title page, Item (54) and in the Specification, Column 1, Line 3:

1. Title of Application, delete "NON-DELAY-LOCK-LOOP MECHANISM" and insert therefor --NON-DELAY-LOCKED-LOOP MECHANISM--

In the Specification:

2. Column 7, line 51, delete "and A1 asserted." insert therefor --and A0 asserted.--

Signed and Sealed this  
First Day of December, 2015

Michelle K. Lee  
*Director of the United States Patent and Trademark Office*